(12) United States Patent
Graube

(10) Patent No.: US 7,046,157 B2
(45) Date of Patent: May 16, 2006

(54) SHORT CIRCUIT DETECTOR FOR SHIELD CONDUCTOR IN A FIELDBUS NETWORK

(75) Inventor: Maris Graube, Gaston, OR (US)

(73) Assignee: Relcom, Inc., Forest Gove, OR (US)

( * ) Notice: Subject to any disclaimer, the term of this patent is extended or adjusted under 35 U.S.C. 154(b) by 79 days.

(21) Appl. No.: 10/716,075

(22) Filed: Nov. 17, 2003

(65) Prior Publication Data

US 2005/0104734 A1    May 19, 2005

(51) Int. Cl.
    *G08B 21/00*    (2006.01)
(52) U.S. Cl. .................. 340/650; 340/651; 324/509; 324/539; 324/541
(58) Field of Classification Search ........... 340/650, 340/651, 652, 647; 324/509–510, 521–526, 324/539–542; 361/62, 64, 93.1
See application file for complete search history.

(56) References Cited

U.S. PATENT DOCUMENTS

| | | | | |
|---|---|---|---|---|
| 3,736,503 A | * | 5/1973 | Coleman et al. | 324/542 |
| 4,227,146 A | * | 10/1980 | Hodge | 324/542 |
| 5,218,307 A | * | 6/1993 | Hiller | 324/541 |
| 5,285,163 A | * | 2/1994 | Liotta | 324/508 |
| 5,477,152 A | * | 12/1995 | Hayhurst | 324/542 |
| 5,631,795 A | * | 5/1997 | Koyama | 361/68 |
| 6,323,652 B1 | * | 11/2001 | Collier et al. | 324/508 |

FOREIGN PATENT DOCUMENTS

| | | | |
|---|---|---|---|
| DE | 3432567 C | * | 12/1985 |
| JP | 09288138 A | * | 11/1997 |

* cited by examiner

*Primary Examiner*—Thomas J. Mullen, Jr.
*Assistant Examiner*—Travis Hunnings
(74) *Attorney, Agent, or Firm*—Chernoff, Vilhauer, McClung & Stenzel, LLP

(57) ABSTRACT

A short circuit detector for a fieldbus network which includes power/data wires that are typically positive and negative, respectively, and a shield conductor connected to a ground includes first and second high-impedance semiconductor circuits coupled between each of the leads and the shield conductors. Both circuits may either have a dedicated alarm indicator which indicates the presence of a short circuit between that conductor and the shield and/or may be coupled together to an alarm circuit which activates an alarm whenever a short circuit exists between either of the power/data leads and the shield conductor. The alarm circuit may have a ground which is isolated from the shield ground and may thus employ an isolation device such as an optoisolator.

10 Claims, 3 Drawing Sheets

SHORT CIRCUIT DETECTOR FOR SHIELD CONDUCTOR IN A FIELDBUS NETWORK

CROSS-REFERENCE TO RELATED APPLICATIONS

Not Applicable.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISK APPENDIX

Not Applicable.

BACKGROUND OF THE INVENTION

The present invention relates to a fieldbus network and, more particularly, to a short circuit detector to protect a fieldbus network from an electrical short between the network's power/data wires and a shield connection.

In a typical industrial plant application, sensors measure position, motion, pressure, temperature, flow, and other parameters related to the operation of process machinery and activities. Actuators, such as valves and motor controllers, control the operation of the machinery and process activities. The sensors and actuators are remotely located from the human and computerized controllers which gather information from the sensors and direct operation of the actuators. A communication network links the controllers with the sensors and actuators located in the field.

Heretofore, communication between controllers, remote sensors, and actuators in industrial applications has been by means of analog signaling. The prevailing standard for analog networking of field devices and the control room in industrial applications has been the Instrument Society of America standard, ISA S50.1. This ISA standard provides for a two-wire connection between the controller and each field device. The wires carry power to the field device and, by the device varying the amount of current it draws, an analog signal representing some parameter, such as temperature or pressure. The signaling current is between 4 mA and 20 mA. The analog signal may be subsequently converted to a digital signal useful to a computerized controller. The wires also supply DC power for operation of the remote sensor or actuator.

Communication utilizing digital signaling reduces the susceptibility of the communication system to noise and provides a capability for conveying a wide range of information over the communication network. Digital communication also permits several different devices to communicate over a single pair of wires. Remote devices used in connection with a digital communication system typically incorporate local "intelligence." This permits sensors and actuators to perform diagnostic, control, and maintenance functions locally. Further, the local intelligence permits the devices to communicate directly with each other and perform some functions without the necessity of involving a central control facility, thus promoting the development of distributed control systems.

Fieldbus is a generic term used to describe a digital, bidirectional, multidrop, serial communication network for connecting isolated field devices, such as controllers, actuators and sensors, in industrial applications. In general, a fieldbus is any two wire or two wire shielded line that is capable of carrying both power and signal to devices on a network. One such fieldbus is defined by the Instrument Society of America standard, ISA SP50.02 and International Electrotechnical Commission standard IEC 61158-2. These standards are utilized in the more detailed specifications for industrial networks promoted by Foundations Fieldbus and Profibus organizations. This system utilizes a two-wire bus to provide simultaneous digital communication and DC power to remotely located devices.

While fieldbus installations are as varied as the industrial applications with which they are used, an exemplary fieldbus installation is illustrated in FIG. 1. A twisted pair cable, comprised of a positive wire, 30, a negative wire 32 and a shield wire, 11, connects a digital control system 4 and a DC power supply 6 with a number of devices 8 (actuators, sensors, power supplies, and local controllers) in the field. The digital control system 4 and the DC power supply 6 may be located in a control room 10. The power supply 6 could be located in the field or at a marshaling panel. If wiring runs are long, it may be desirable to power the network from more than one point with additional power supplies 15. A power conditioner 22 is necessary to isolate the DC power supplies from the bus. The DC power supply will attempt to maintain a constant output voltage that, in the absence of isolation, would prevent propagation of the digital signal on the network. The shield is grounded at only one place along the cable. The outputs of the power supply are galvanically isolated from that ground. Hence the positive and negative wires of the cable only have a definite voltage between them and these voltages are not related to the ground. The development of the digital fieldbus may also mean that controllers are located in the field.

Several devices 8 can be connected to the home run 2 by spur cables 14 at a terminal referred to as a chicken foot 12 which incorporates signal termination for the home run. A terminator 16 comprising a resistor 18 and a series capacitor 20 connected across the wires of the home run cable 2 must be provided at both ends of the home run cable 2. The varying voltage of the digital signal is produced when an attached device varies the current drawn from the network producing a voltage drop across the resistor 18 of the terminator 16. The capacitor 20 of the terminator 16 prevents dissipation of the DC power through the terminator resistor 18 while permitting transmission of the high frequency digital signal on the bus. In addition, the terminators 16 serve to prevent signals from reflecting from the ends of the home run wires 2. The home run 2 is surrounded by a conductive sleeve or shield 11 which is connected to ground. The shield 11 helps to prevent RF noise from corrupting the data signal on the home run 2. A problem can occur, however, if either of the two wires of the home run 2 are short-circuited to the shield 11. The power supply leads have a given voltage differential between them but are not referenced to any other voltage or to the ground to which the cable shield 11 is connected. If either of the two wires of the twisted pair becomes coupled to the shield 11 through improper cable installation, deterioration of the cable such as a tear or a cut, or workman's error, the performance of the network can be substantially degraded.

First, since the network's power signal wires are a twisted pair, they are usually relatively immune to noise because they are balanced. Voltages induced by noise are present on both wires equally and thus appear as common mode voltage. Common mode voltage is relatively harmless because receivers in the devices connected to the cable are designed to reject it. If, however, one wire of the twisted pair becomes shorted to the shield, the two wires will no longer be balanced. Noise voltage would then affect one wire more than the other and would produce a differential noise. Differential noise is difficult, if not impossible, for receivers in the downstream devices to eliminate and therefore degrades the receiver's ability to detect signals correctly.

Secondly, a short between one of the cable wires and the shield can disable current limiting devices that are typically used between the trunk cable and the drop cable. Such devices are shown, for example, in U.S. Pat. No. 6,369,997 and in U.S. Pat. No. 6,366,437. These current limiting devices depend on the signal and power wires being galvanically isolated from the shield, that, is, not electrically conducting, to the shield. If they are not, a short circuit on the drop cable can bypass the protective current limiting circuit and cause the loss of power to the entire network.

Often when a failure occurs, its cause is not readily known. If an entire trunk cable loses power, the entire system is shut down until it can be determined whether the problem lies with the various components such as power supply and power conditioning circuits, devices connected to the trunk cable, or the trunk cable itself. This type of diagnostic work is costly and time-consuming.

BRIEF SUMMARY OF THE INVENTION

A short circuit detector for a fieldbus network which includes power/data wires that are typically positive and negative, respectively, and a shield conductor connected to a ground includes first and second high-impedance semiconductor circuits coupled between each of the leads and the shield conductors. Both circuits may either have a dedicated alarm indicator which indicates the presence of a short circuit between that conductor and the shield and/or may be coupled together to an alarm circuit which activates an alarm whenever a short circuit exists between either of the power/data leads and the shield conductor. The alarm circuit may have a ground which is isolated from the shield ground and may thus employ an isolation device such as an opto-isolator.

The foregoing and other objectives, features and advantages of the invention will be more readily understood upon consideration of the following detailed description, taken in conjunction with the accompanying drawings.

BRIEF DESCRIPTION OF THE SEVERAL DRAWINGS

DETAILED DESCRIPTION OF THE INVENTION

Figure 1:
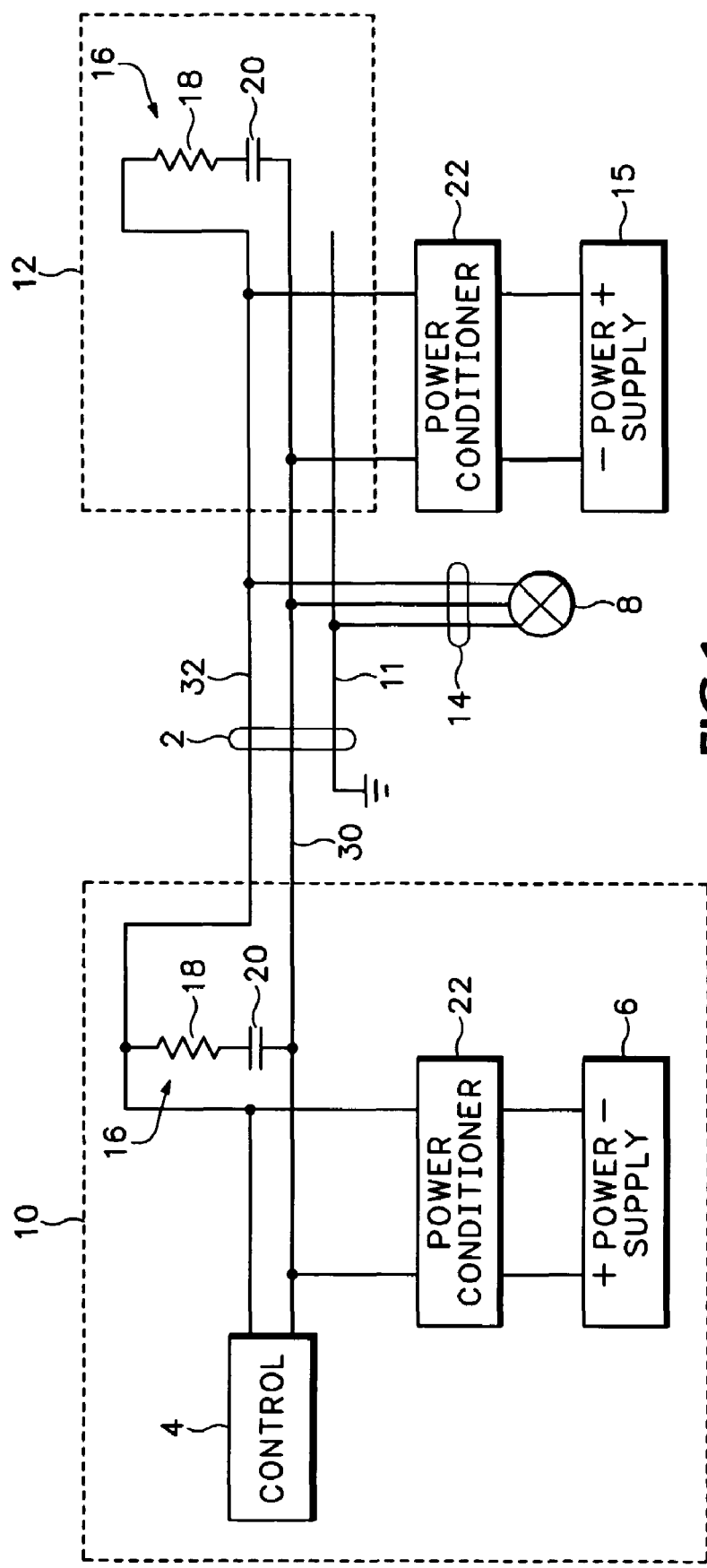
FIG. 1 is a block diagram of an exemplary fieldbus network installation.
Figure 2:
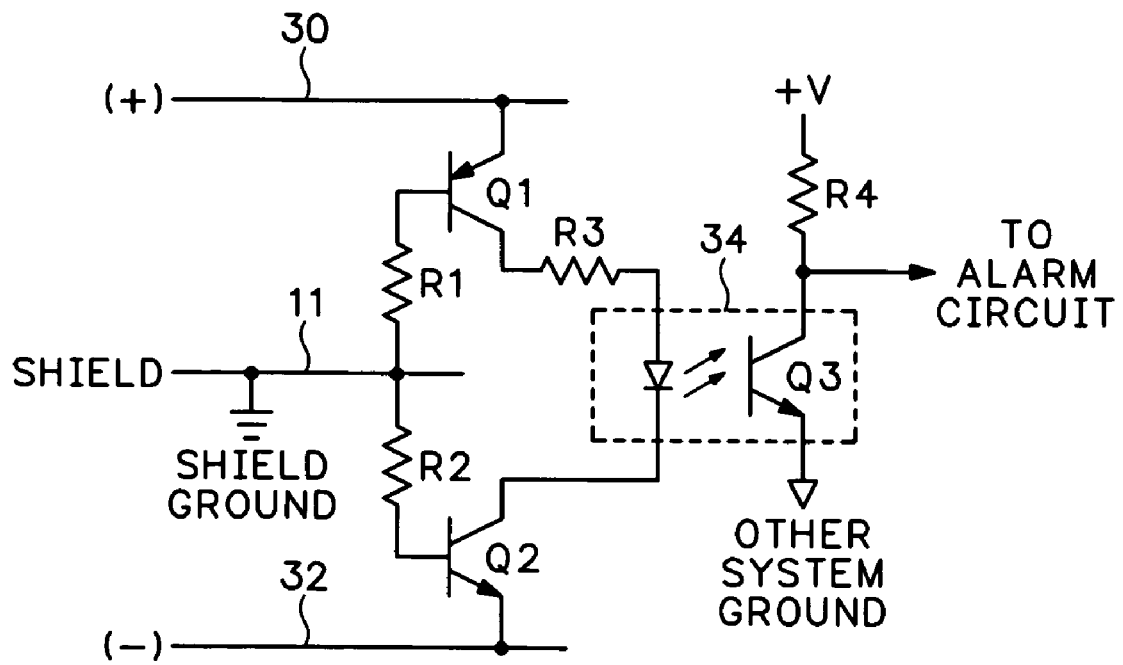
FIG. 2 is a schematic diagram of a preferred embodiment of the short circuit detector of the present invention.

Referring to FIG. 2, a fieldbus home run cable 2, when connected to a power supply such as power supply 6 of FIG. 1, includes a positive lead 30 and a negative lead 32. A shield conductor 11 is a grounded sleeve or jacket that encircles the positive and negative leads 30, 32. In a typical fieldbus installation, the positive and negative leads are connected to a twenty-four-volt power supply through a power conditioner (22). The positive lead 30 is connected to the emitter of transistor Q1. The base of Q1 is connected through a resistor R1 to the shield 11. Similarly, the negative lead 32 is connected to the emitter of transistor Q2 and the base of Q2 is connected to the shield 11 through resistor R2. The collector of Q1 is coupled through a resistor R3 to the light-emitting diode ("LED") of an opto-isolator isolator 34. The output of the LED in the opto-isolator 34 is connected to the collector of Q2.

The isolated side of the opto-isolator 34 comprises a photosensitive transistor Q3 coupled between a source of positive voltage and a system ground through a resistor R4. The system ground is a different ground reference from the ground to which the shield is connected.

Resistors R1 and R2 are chosen so as to provide a relatively high impedance. This is so that the data signals on the twisted pair 30, 32 are not adversely effected by the current drawn by R1 and R2. If these impedances are equal, there will be approximately twelve volts on the positive lead 30 and minus twelve volts on the negative lead 32. The shield will be at zero volts. However if either the positive or the negative lead 30 or 32 become shorted to the shield 11, the voltage differential between the other lead and the shield will rise to twenty-four volts.

Normally, Q1 and Q2 are on as a result of the voltage of developed by R1 and R2. With Q1 and Q2 in the "on" state, the LED in the opto-isolator 34 is lit which, in turn, causes Q3 to conduct. If there is a the short circuit of either the positive or the negative lead to the shield, that lead's respective transistor Q1 or Q2 will turn off. If either Q1 or Q2 are turned off, current no longer flows through the LED in the opto-isolator 34 and Q3 is thus turned off. At the same time, the collector of the transistor Q3 is pulled high by resistor R4. This high voltage turns on the alarm and indicates the existence of a short between one of the wires and the cable shield. The alarm may be any type of conventional alarm circuit that provides either a visual or audible indication or both. The alarm circuit is connected to a separate ground on the other side of the opto-isolator 34 from the high-impedance circuits of Q1 and Q2. This is necessary because a short to a common ground (where the shield is connected) could short out the alarm circuit as well.

Figure 3:
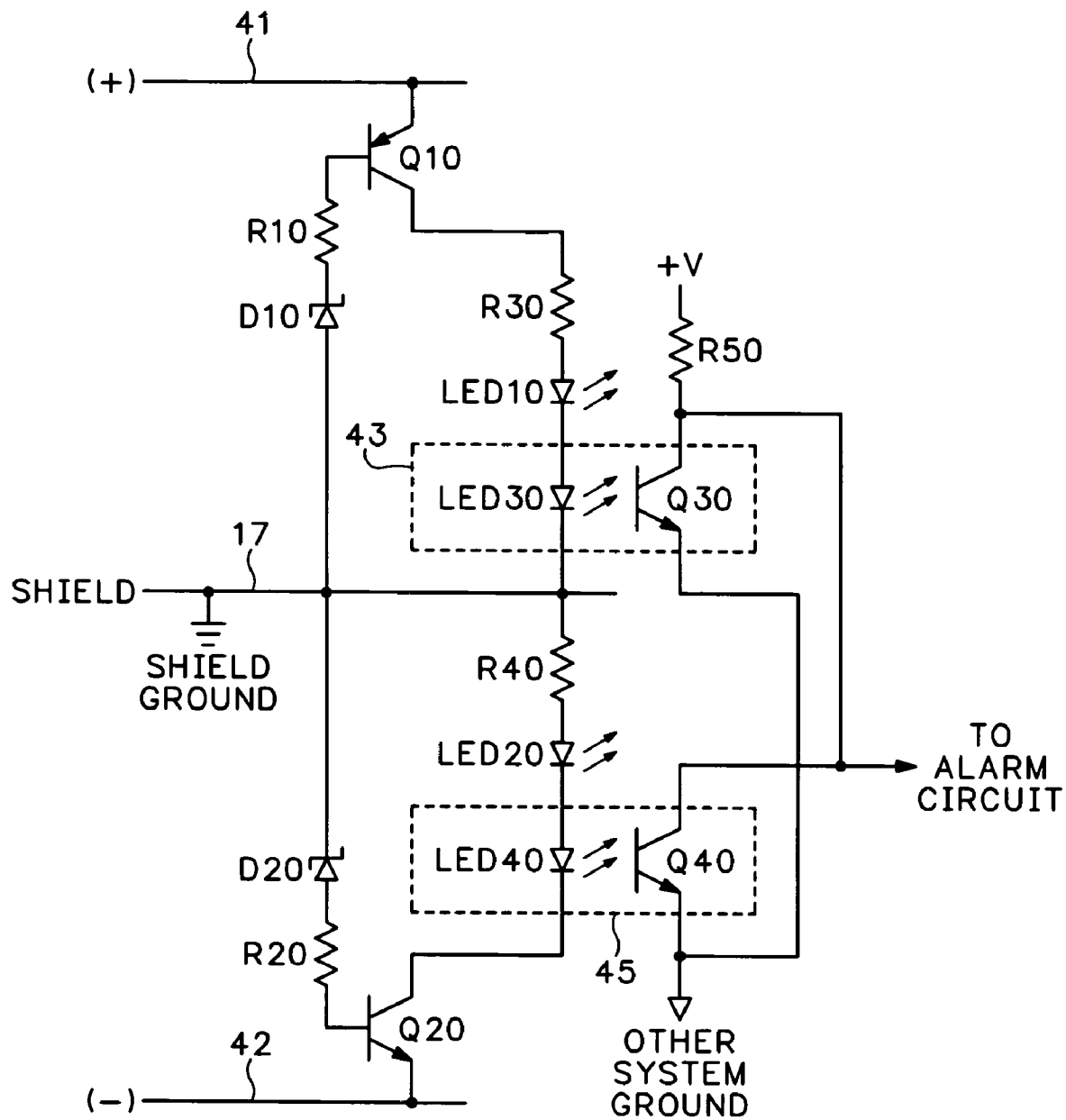
FIG. 3 is a schematic diagram of an alternative embodiment of a short circuit detector.

An alternative embodiment of a short circuit detector for a fieldbus cable is shown in FIG. 3. The circuit of FIG. 3 is similar to the circuit of FIG. 2. This circuit, however, provides an indication as to which wire in the fieldbus trunk line has shorted to the shield.

The positive wire 41 is coupled to a network comprising transistor Q10, resistor R10 and zener diode D10. The other side of the zener diode D10 is connected to the shield 17. The collector of transistor Q10 is coupled to resistor R30 and LED10 which is, in turn, connected to opto-isolator 43. Opto-isolator 43 comprises LED30 and transistor Q30. A similar circuit including opto-isolator 45 is coupled between the negative wire 42 and the shield 17. Resistor R40 is connected between the shield 17 and LED20 which is, in turn, connected to opto-isolator 45. Opto-isolator 45 comprises LED40 and transistor Q40. The collector of a transistor Q20 is coupled to the opto-isolator 45 and its base is connected to the shield through resistor R20 and zener diode D20. The collectors of transistor Q30 and transistor Q40 are connected to alarm circuitry and connected through pull-up resistor R50 to voltage source +V for the alarm circuitry.

Normally Q10 and Q20 are off because there is not enough current flowing through the respective zener diodes D10, D20 to turn on the transistors through their bases. If a short occurs between either the positive wire 41 and the shield 17 or the negative wire 42 and the shield 17, the resulting voltage exceeds the breakdown point of the respective zener diode and the transistor, Q10 or Q20 as the case may be, turns on. This turns on the LED in the respective opto-isolator 43 or 45 which in turn triggers the alarm circuit. Thus the LED, either LED 10 or LED 20 indicates the line that has shorted out.

Figure 4:
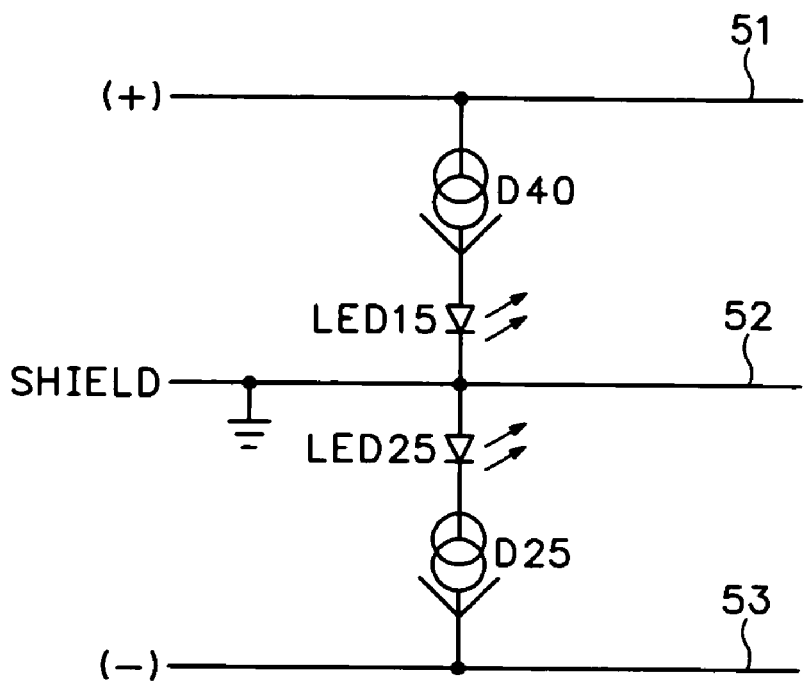
FIG. 4 is a schematic diagram of a third embodiment of a short circuit detector.

Yet a third embodiment is shown in FIG. 4. Constant current diodes D40 and D25 are connected between the positive wire 51, the negative wire 53 and the shield 52, respectively. LED's 15 and 25 are coupled to diodes D40 and D25, respectively. In this embodiment the LED's are on because the constant current diodes provide a small leakage current that maintains them in an "on" state. If a short circuit occurs, the effected LED goes out, indicating the presence of the short circuit.

Any of the three circuits illustrated can be hard wired into the fieldbus network or can be used as part of a portable test kit. A convenient way to test for short circuits with a portable kit would be to test the circuit at the power supply.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A short circuit detector for a fieldbus network, said network comprising at least one of a digitally controlled sensor or actuator coupled to a negative lead, a positive lead and a shield conductor and comprising:
    a) a digital control circuit for propagating a digital signal over said network;
    b) at least one power supply circuit coupled to said network for supplying power to at least one of said digitally controlled sensor or actuator;
    c) a first high impedance semiconductor circuit coupled between said positive lead and said shield conductor and having a first output;
    d) a second high impedance semiconductor circuit coupled between said negative lead and said shield conductor and having a second output; and
    e) an alarm circuit coupled to said first and second outputs for activating an alarm whenever a short circuit exists between either of said positive or negative leads and said shield conductor.

2. The short circuit detector of claim 1 wherein said alarm circuit includes a ground connection that is isolated from shield conductor.

3. The short circuit detector of claim 2 wherein the alarm circuit includes an opto-isolator device.

4. The short circuit detector of claim 1 wherein each of the first and second high impedance semiconductor circuits have a visual indicator device for identifying whether a short circuit has occurred in either the positive or the negative line.

5. The short circuit detector of claim 1 wherein each of the first and second high impedance semiconductor circuits include a zener diode for blocking current except in a short circuit condition.

6. The short circuit detector of claim 5 wherein each of the first and second high impedance semiconductor circuits includes a semiconductor device coupled to an opto-isolator device.

7. The short circuit detector of claim 6 wherein each opto-isolator device is coupled to an alarm circuit.

8. In combination, a fieldbus network and a short circuit detector, said fieldbus network comprising a plurality of network components interconnected by a positive line, a negative line and a shield conductor, and including:
    a) a digital control circuit for propagating a digital signal over said network to said network components;
    b) at least one power supply circuit for supplying DC power to one or more of said network components; and
    said short circuit detector comprising a first high impedance alarm circuit coupled between said positive line and said shield conductor and a second high impedance alarm circuit coupled between said negative line and said shield conductor.

9. The short circuit detector of claim 6 wherein said first and second high impedance alarm circuits each comprise a constant current diode connected in series with an alarm indicator device.

10. The short circuit detector of claim 9 wherein said alarm indicator device is a light emitting diode.

* * * * *